United States Patent
Petruzzi

(10) Patent No.: US 8,373,497 B2
(45) Date of Patent: Feb. 12, 2013

(54) SYSTEM AND METHOD FOR PREVENTING BIPOLAR PARASITIC ACTIVATION IN A SEMICONDUCTOR CIRCUIT

(75) Inventor: Luca Petruzzi, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 102 days.

(21) Appl. No.: 13/004,722

(22) Filed: Jan. 11, 2011

(65) Prior Publication Data

US 2012/0176161 A1   Jul. 12, 2012

(51) Int. Cl.
*H03K 3/01* (2006.01)
*G05F 1/10* (2006.01)

(52) U.S. Cl. ......... 327/534; 327/535
(58) Field of Classification Search ......... 327/534, 327/535
See application file for complete search history.

(56) References Cited

U.S. PATENT DOCUMENTS

| | | | | |
|---|---|---|---|---|
| 5,920,226 A * | 7/1999 | Mimura | | 327/537 |
| 6,373,321 B1 * | 4/2002 | Yamauchi et al. | | 327/534 |
| 6,621,327 B2 * | 9/2003 | Kitamoto | | 327/537 |
| 6,965,151 B2 * | 11/2005 | Burr | | 257/369 |
| 7,012,461 B1 * | 3/2006 | Chen et al. | | 327/535 |
| 7,119,604 B2 * | 10/2006 | Chih | | 327/534 |
| 7,355,437 B2 * | 4/2008 | Perisetty | | 326/14 |
| 7,427,890 B2 * | 9/2008 | Chan | | 327/536 |
| 7,583,131 B2 * | 9/2009 | Kimura et al. | | 327/534 |
| 7,605,601 B2 * | 10/2009 | Tachibana et al. | | 326/21 |
| 2008/0224547 A1 * | 9/2008 | Pastorina et al. | | 307/130 |
| 2010/0039163 A1 * | 2/2010 | Nagasawa et al. | | 327/534 |
| 2010/0073073 A1 * | 3/2010 | Bertram et al. | | 327/534 |

* cited by examiner

*Primary Examiner* — Thomas J Hiltunen
(74) *Attorney, Agent, or Firm* — Slater & Matsil, L.L.P.

(57) ABSTRACT

In an embodiment, a semiconductor device has a semiconductor body of a first semiconductor type, a first region of a second semiconductor type disposed in the semiconductor body, and a second region of the first semiconductor type disposed within the first region, where the second semiconductor type is opposite the first semiconductor type, and where an interface between the first region and the semiconductor body forms a first diode junction. The semiconductor device also has a comparator with a first input coupled to the semiconductor body and a second input coupled to the first region, and a switch having a first output node coupled to the first region, and a second output node coupled to the semiconductor body. The semiconductor body, the first region and the second region are configured to be coupled to a first supply voltage, a second supply voltage, and a third supply voltage, respectively.

23 Claims, 8 Drawing Sheets

SYSTEM AND METHOD FOR PREVENTING BIPOLAR PARASITIC ACTIVATION IN A SEMICONDUCTOR CIRCUIT

TECHNICAL FIELD

This invention relates generally to semiconductor devices and methods, and more particularly to a system and method for preventing parasitic bipolar activation in a semiconductor circuit.

BACKGROUND

One common and ongoing problem faced by the electronics industry is the protection of circuit components against electrostatic discharge (ESD). Generally, ESD is the transfer of an electrostatic charge between bodies at different electrostatic potentials or voltages, caused by direct contact or induced by an electrostatic field. Integrated circuits, in particular, have become more prone to damage or destruction from ESD as their internal structures and geometric features have become smaller.

The management and prevention of ESD is especially challenging in industrial and automotive environments, where high voltage circuits are common, and where the operation of motors, machinery and other inductive circuits can generate large power-line disturbances. In order to facilitate the design of circuits that can operate in such environments, organizations, such as the International Organization for Standards (ISO), have developed standards outlining the type of electrical environment such circuits should withstand.

One example of such a standards is ISO 10605:2008, entitled, "Road vehicles—Test methods for electrical disturbances from electrostatic discharge." FIG. 1 illustrates a negative test pulse defined by ISO 10605 that represents a possible power line disturbance caused by inductive switching within the automotive environment. Here, the test pulse starts at a nominal battery voltage $U_A$ of about 12V. The test pulse is decreased to zero volts and then transitions from zero volts to between −75V to −100V with a 10% to 90% rise time ($t_r$) of about 1 µs. If applied to a system power supply voltage, this test pulse represents a very rapid change in the polarity and supply voltage of any component coupled to a power supply. In order for a circuit to withstand such a pulse, on-chip and off-chip ESD, clamping and ISO structures are used to protect the circuit.

SUMMARY OF THE INVENTION

In an embodiment, a semiconductor device has a semiconductor body of a first semiconductor type, a first region of a second semiconductor type disposed in the semiconductor body, and a second region of the first semiconductor type disposed within the first region, where the second semiconductor type is opposite the first semiconductor type, and where an interface between the first region and the semiconductor body forms a first diode junction. The semiconductor device also has a comparator with a first input coupled to the semiconductor body and a second input coupled to the first region, and a switch having a first output node coupled to the first region, and a second output node coupled to the semiconductor body. The semiconductor body, the first region and the second region are configured to be coupled to a first supply voltage, a second supply voltage, and a third supply voltage, respectively.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely preventing bipolar parasitic activation in a n-type substrate technology. The invention may also be applied, however, to providing ESD, latch-up and ISO-pulse protection in other semiconductor technologies using other substrate types, such as a p-type substrates.

In an embodiment of the present invention, current flow from a collector to an emitter of a parasitic bipolar transistor is prevented by sensing an activation condition and coupling the base and emitter of the parasitic bipolar transistor together when the activation condition is sensed. In an embodiment where an n-type substrate is normally coupled to a battery supply, a ground connection is normally coupled to a p-type isolation region, and a digital power supply is normally coupled to an n-well within the p-type isolation region, the activation condition is sensed when the battery supply voltage is decreased to the point of approaching the voltage of the ground connection.

Figure 2:
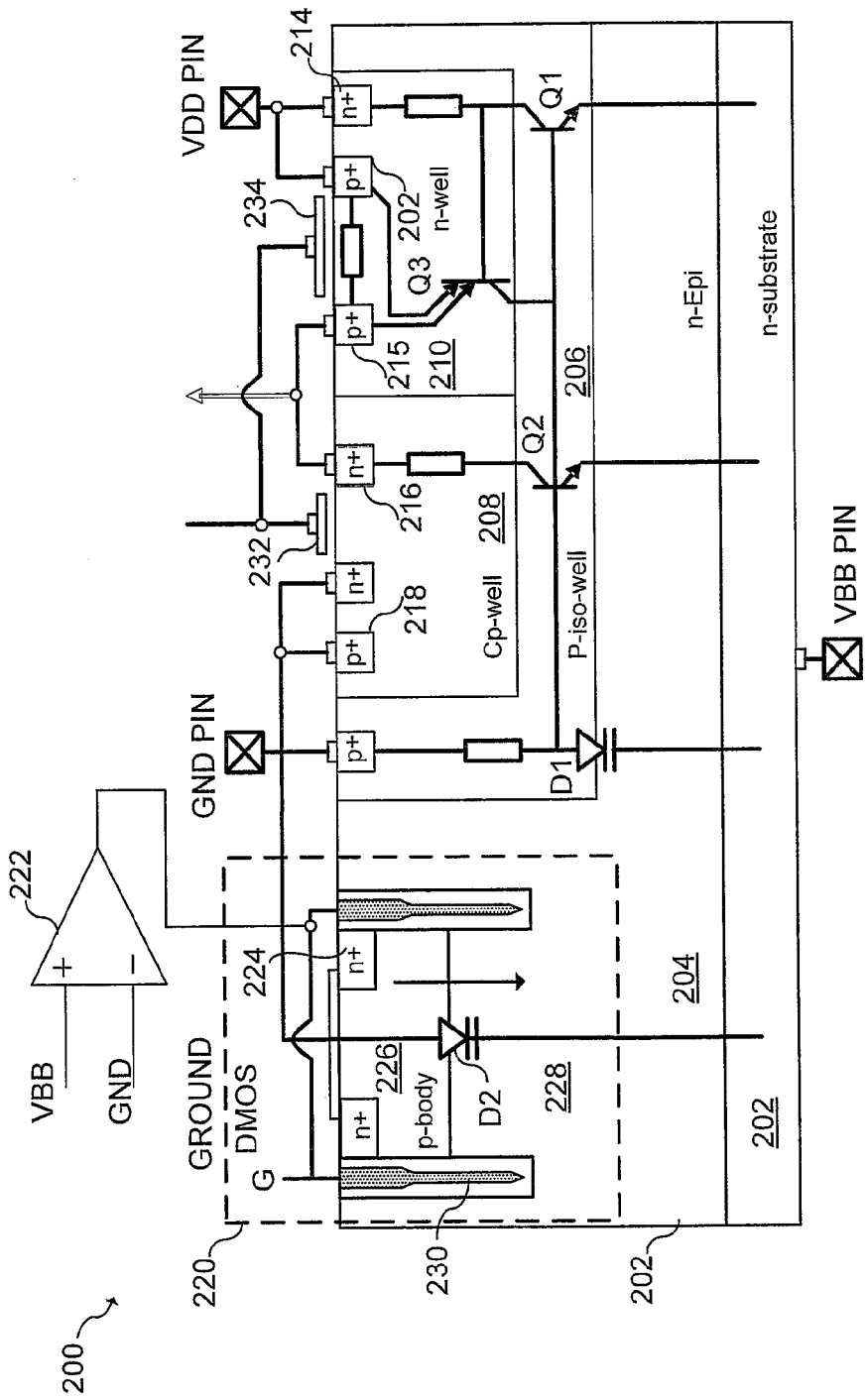
FIG. 2 illustrates a cross-section of an embodiment integrated circuit.

FIG. 2 illustrates cross-section 200 of an embodiment integrated circuit having n-type substrate 202 on which n-type epitaxial layer 204 is formed. In an embodiment, a battery voltage is applied to substrate 202 via the VBB pin. In an embodiment, the VBB pin is biased to between about 11V to about 14V, however, in alternative embodiments, other voltages can be used depending on the specific embodiments and its specifications. P-type isolation well 206 is formed with n-epi layer 204 and is nominally coupled to a ground voltage via pin GND and p+ well contact 218. In an embodiment, digital circuitry is contained within p-well region 208 and n-well region 210, which are formed within p-type isolation region 206. Pin VDD is configured to be coupled to a digital power supply having a voltage, for example of 3.3V or 5V, however, other supply voltages can be used in other embodiments. Alternatively, other types of circuits, such as analog circuits can be formed within these well regions. In an embodiment, n-well 210 is coupled to the VDD voltage via n+ contact 214. In an embodiment using a CMOS process, NMOS device 232 is formed in p-well 208 and PMOS device 234 is formed in n-well 210 using techniques known in the art. Accordingly, other devices such as capacitors, resistors, and other transistors types such as Bipolar transistors and JFETs can also be formed in p-well 208 and n-well 210. It should be appreciated that alternative embodiments can use alternative structures. For example, in some embodiments, the epitaxial layer can be omitted.

In an embodiment, parasitic bipolar devices Q1, Q2 and Q3 are formed as a consequence of the way particular semiconductor layers and devices are interfaced. Parasitic bipolar device Q1 has a base formed by p-type isolation region 206, an emitter formed by n-epi 204, and a collector formed by n-well 210; parasitic bipolar device Q2 has a base formed by p-type isolation region 206, an emitter formed by n-epi 204, and a collector formed by n+ drain region 216; and parasitic PNP bipolar device Q3 has a base formed by formed by n-well 210, an emitter formed p+ source/drain diffusions 202 and 215, and a collector formed p-type isolation well 206. The interface between p-type isolation well 206 and n-epi 204 is represented by junction diode D1.

Without ESD and/or ISO pulse protection being applied, if the voltage at VBB is biased below the voltage at pin GND, the base-emitter junctions of parasitic bipolar devices Q1 and Q2 become forward biased, and parasitic bipolar transistors Q1 and Q2 are turned on. In some cases, an appreciable current can flow from the VDD pin to the VBB pin. Furthermore, as parasitic bipolar transistors Q1 and Q2 are turned on, the base of parasitic bipolar transistor Q3 is pulled low, thereby further pulling the base of transistors Q1 and Q2 up to VDD and causing the parasitic bipolar transistors to latch-up.

In one embodiment, as is discussed further below, current limiting resistors can be placed in series with the VBB pin and the VDD pin to prevent a destructively large current from flowing through parasitic bipolar transistors Q1 and Q2 when diode D1 becomes forward biased. In some situations, even with current limiting resistors, a negative pulse at VBB will cause a disturbance within the circuitry located within p-well 208 and n-well 210. Such a disturbance can, for example, cause logic circuits to change their state, or disturb the states of analog circuits disposed within p-well 208 and n-well 210. Changing such an analog or digital state can, in some embodiments, cause erratic and unpredictable behavior in the target application.

In an embodiment, the onset of condition that could activate bipolar devices Q1 and Q2 is sensed by comparator 222. When comparator 222 senses that the voltage at VBB is about to go below ground, comparator 222 activates a switch coupled between ground pin GND and battery pin VBB. In the illustrated embodiments, this switch is implemented using DMOS device 220. In one embodiment, DMOS device 220 is a trench-type device, however, in alternative embodiments other power-MOSFET types such as planar DMOS, or other non-power MOSFET device types can be used such as high voltage NMOS devices. In an embodiment, DMOS device has n+ sources 224 coupled to ground, gate material in trenches 230, p-body 226 and drain region 228. Diode D2 represents the diode junction formed between p-body 226 shorted to n+ sources 224 and n-type drain region 228 having n-epi 204 and n-type Substrate 202. When DMOS device 220 is activated, a low impedance path is created between GND and VBB. This low impedance path prevents the base-emitter junction of parasitic bipolar devices Q1 and Q2 from becoming appreciably forward biased. In one embodiment, this forward bias is limited to between about 0 mV and 300 mV. Alternatively, this forward bias can be limited to different voltage ranges.

In an embodiment, the threshold of comparator 222 is set to a small positive voltage, for example about 30 mV, or between 20 mV and 40 mV in order to make sure that the comparator 222 is activated fast enough to prevent transistors Q1 and Q2 from turning on. Alternatively, the threshold of comparator 222 can be set to zero voltage or to other voltage levels.

Figure 3:
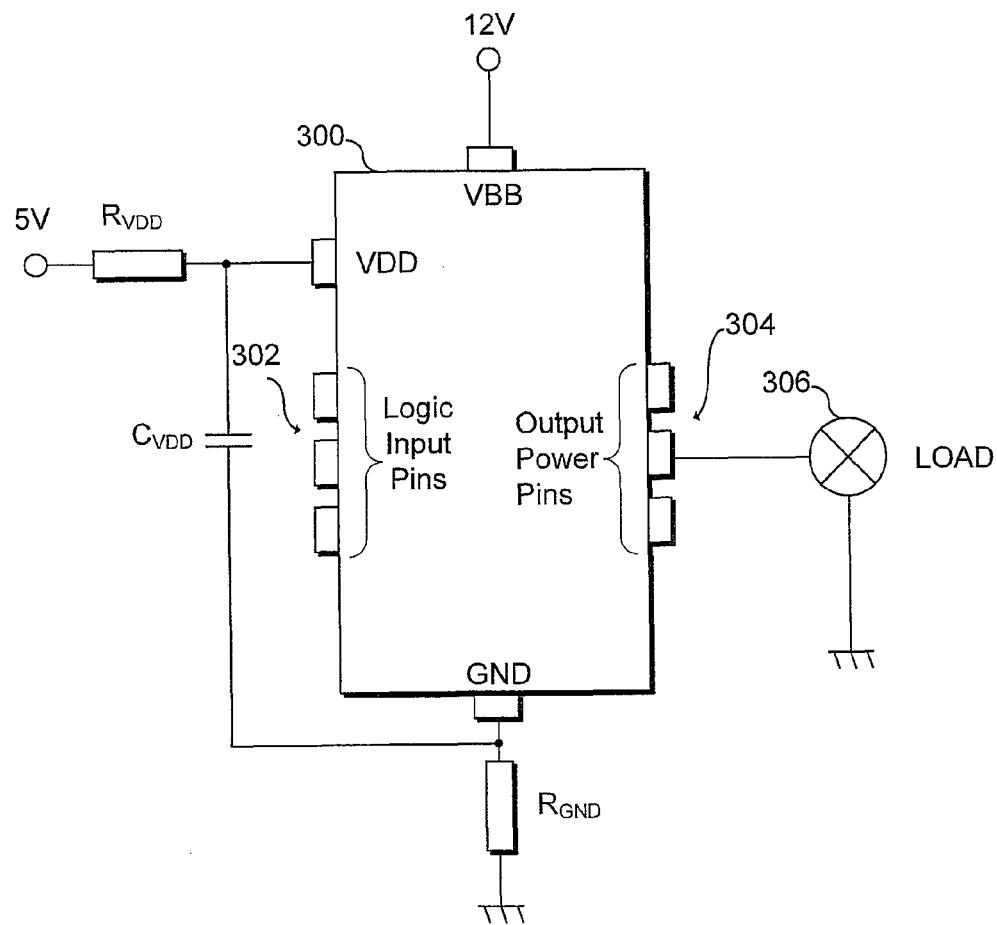
FIG. 3 illustrates an embodiment high-side driver integrated circuit.

FIG. 3 illustrates high-side driver integrated circuit (IC) 300. In an embodiment, lamp driver 300 has output power pins 304 that are configured to connect, for example, load 306 to battery voltage VBB. Logic input pins 302 are configured to control the state of IC 300, and the state of output power pins 304. In one embodiment, load 306 is a lamp. However, high-side driver IC 300 can also be used to drive other types of loads including, but not limited to motor coils, solenoids, and switched-mode power supplies, and. In an embodiment, resistor $R_{VDD}$ is placed in series with pin VDD and resistors $R_{GND}$ is placed in series with pin GND in order to limit the current if diode D1 (FIG. 2) becomes forward biased. In an embodiment, $R_{VDD}$ is about 500Ω and $R_{GND}$ is about 100Ω, however, other alternative values can be used in other embodiments. Capacitor $C_{VDD}$ is a decoupling capacitor coupled between the VDD pin and the GND pin. In an embodiment, VDD is biased to about 5V above GND, and VBB is biased to about 12V above GND. Alternatively, VDD can be biased to other voltages and VBB have an operating voltage of up to about 50V to 60V in some embodiments, and even higher in other embodiments.

Figure 4:
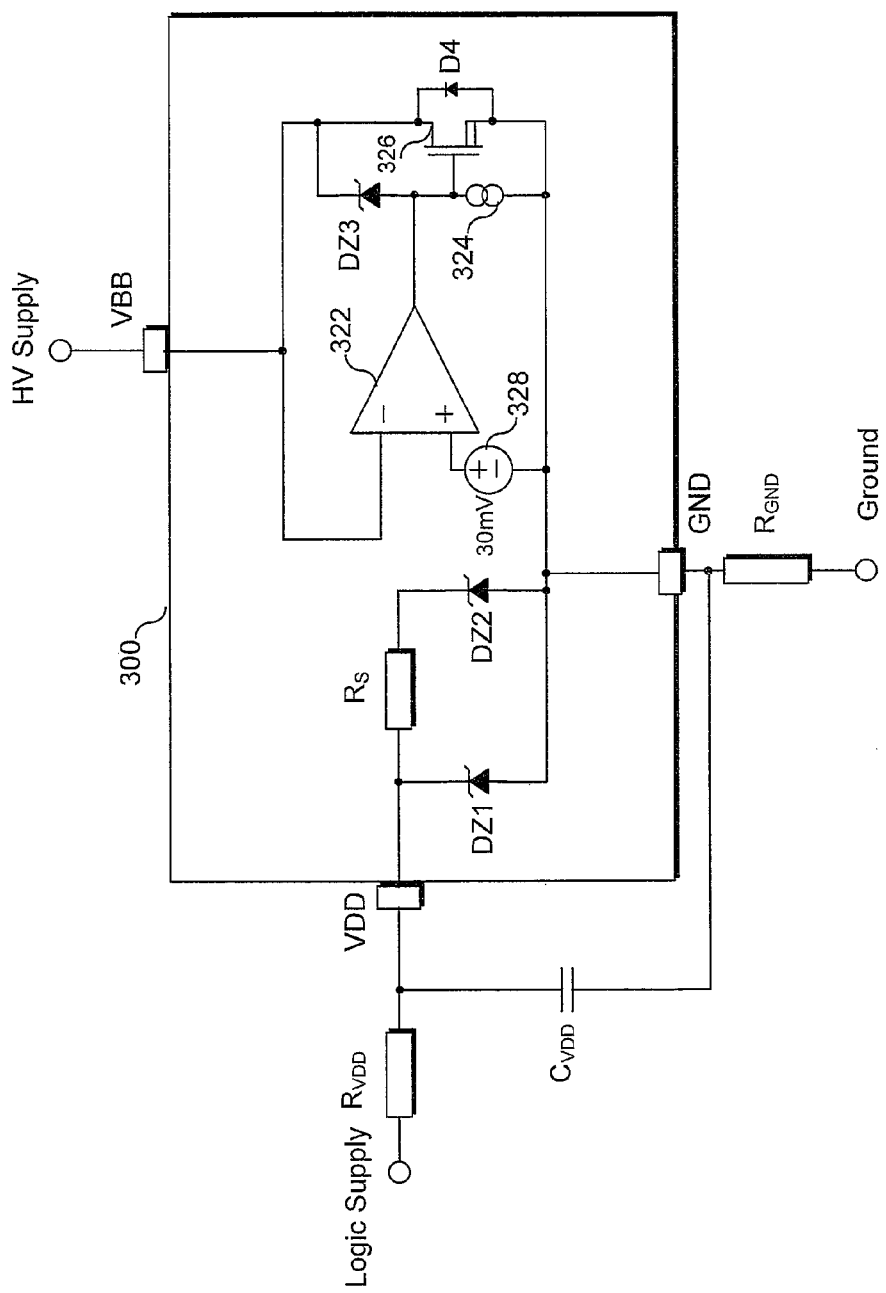
FIG. 4 illustrates an embodiment ESD device.

FIG. 4 illustrates embodiment ESD devices within high-side driver IC 300. In an embodiment zener diodes DZ1 and DZ2 and internal resistor $R_S$ clamp supply VDD and provide current limiting. In one embodiment, the zener voltage of DZ1 and DZ2 is about 7 volts, and resistor $R_S$ is about 100 ohms. Alternatively, other zener voltages and resistor values can be used. Comparator 322 compares the voltage at VBB with GND, and activates ESD clamping DMOS device 326 if the negative terminal goes below the positive terminal of comparator 322. In one embodiment, DMOS device 326 is an enhancement device having a threshold of between about 2V and about 3V. Alternatively, other device types and other thresholds can be used. In some embodiments, offset 328 is introduced to ensure that the DMOS device is turned on before VBB appreciably goes below GND. As discussed above, this offset can be between about 20 mV and 40 mV, or have values outside of this range. In an embodiment, clamping zener diode DZ3 provides protection for DMOS device 326. Diode D4 is the bulk diode of transistor 326. In one embodiment, the zener voltage of DZ3 is about 45 volts, and the bias current of current source 324 is about 100 μA. In alternative embodiments, other zener voltages and bias currents can be used.

In an embodiment resistor $R_{VDD}$ limits the current though diode DZ1 of the ESD protection structure in case the GND voltage is higher than the VDD voltage. This can occur, for example, in a reverse polarity situation, a ground voltage shift, or a negative going ESD pulse.

Figure 1:
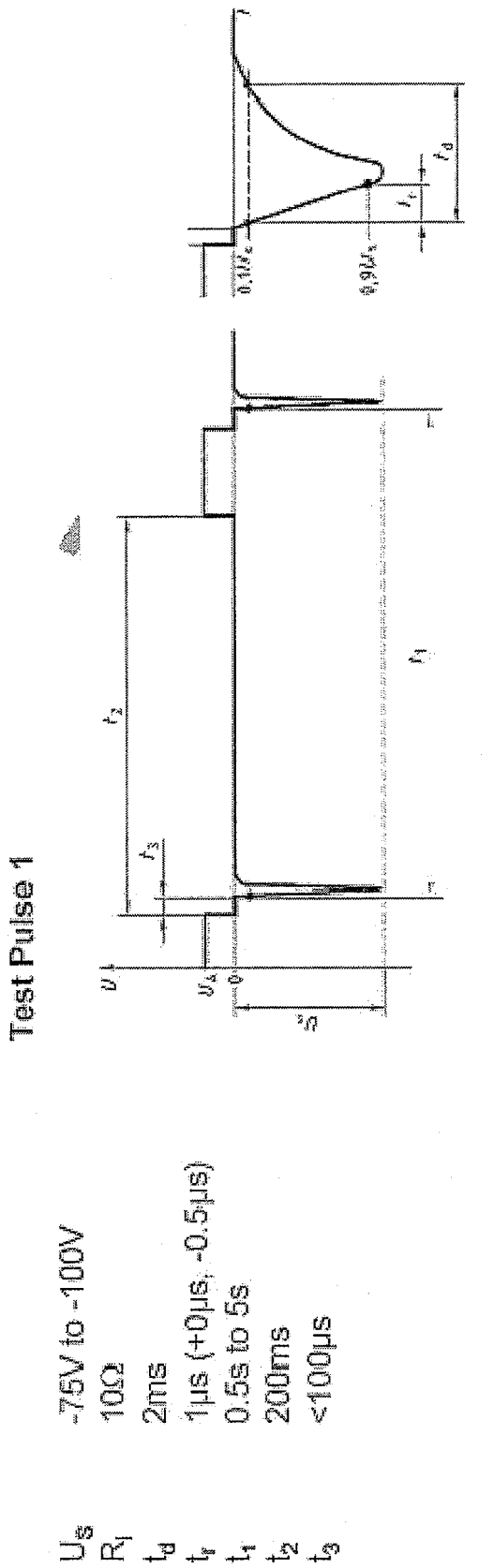
FIG. 1 illustrates a negative ISO pulse.
Figure 5:
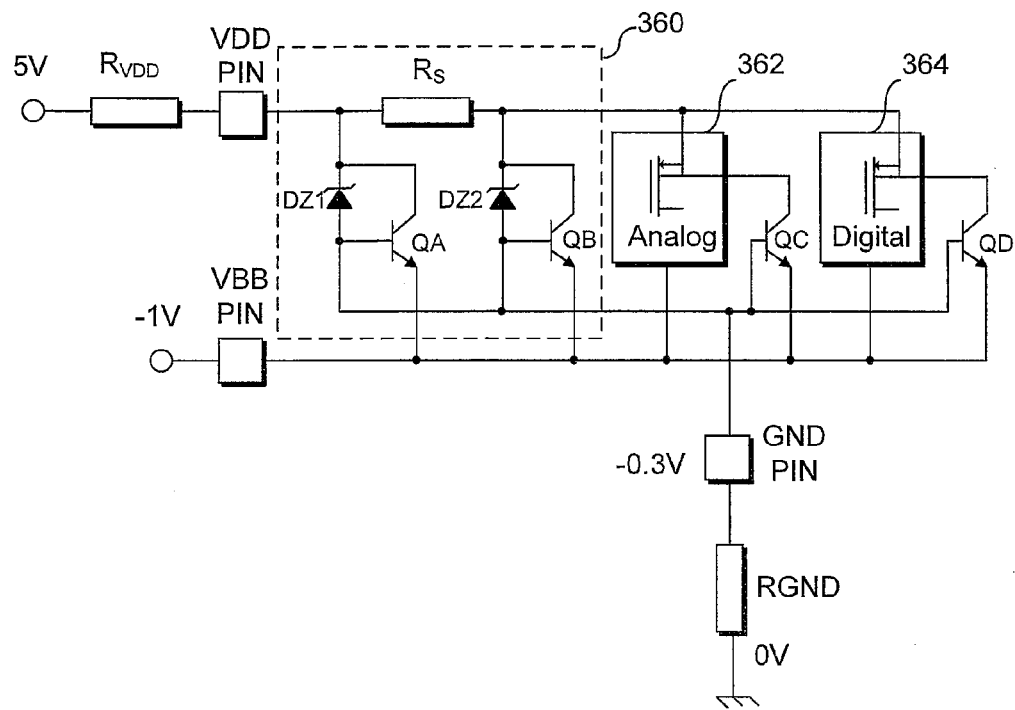
FIG. 5 illustrates an embodiment ESD structure.

FIG. 5 illustrates how embodiment ESD structure 360 interacts with analog power domain 362, digital power domain 364, and parasitic bipolar devices QA, QB, QC and QD in the presence of a negative voltage condition on pin VBB, when VBB assumes a voltage below ground. Here, bulk connections in the PMOS devices in analog and digital domains 362 and 364 form the collectors of the parasitic bipolar devices. In an embodiment, this negative voltage condition can be brought about by applying an external voltage on the supply pins, or by applying a negative pulse at VBB, such as ISO-Pulse 1 shown in FIG. 1.

In the illustrated example, 5V is applied to VDD, and −1V is applied to VBB. If VBB and GND are not coupled together via an embodiment switch, a junction diode between the p-type isolation region and n-type substrate, and the base emitter junctions of parasitic bipolar devices QA, QB, QC and QD become forward biased, leaving the GND pin at 0.3V, or one diode voltage above VBB. As discussed above, appreciably forward biasing the base emitter junctions of the parasitic bipolar devices can cause current to flow though the collectors of the parasitic bipolar devices. In the case of a negative going ESD ISO pulse, current flowing though parasitic bipolar transistors QA, QB, QC and QD causes a voltage drop on $R_{VDD}$ and on $R_S$. In some cases, this voltage drop can be between about 1V and about 2V for a 20 mA to 40 mA collector current, and can cause loss and corruption of logic states within analog and digital domains 362 and 364. In some embodiments, this voltage drop can also cause a reset condition, for example, in a power-on reset circuit that resets on-chip logic to a initial logic state. In such cases, the device could not be operated correctly during a negative ISO-Pulse. Moreover the functionality of the IC is affected also after the ISO-Pulse because the memory elements of the digital part are reset.

Figure 6:
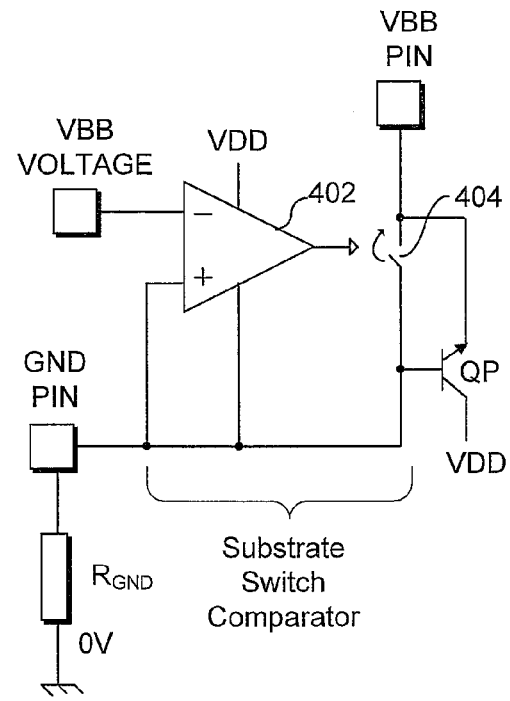
FIG. 6 illustrates an embodiment substrate switch comparator and substrate switch.

FIG. 6 illustrates embodiment substrate switch comparator 402 and switch 404. In an embodiment, comparator 402 is biased between VDD and GND, and compares the voltage at the battery VBB pin with the voltage at the GND pin. If the VBB voltage is, for example, 30 mV higher than GND, switch 404 is activated. In further embodiments, a different voltage offset can be used. For example, in some embodiments, these voltage offset can be between 20 mV and 40 mV, and in other embodiments, other offset voltages outside of this range can be used. In the case of a negative ISO-Pulse, the comparator reacts before the VBB voltage enters the negative domain, thereby preventing the activation of NPN parasitic transistors QP. In an embodiment, switch 404 is dimensioned such that the dynamic current flowing through switch 404 during an ISO-Pulse determines has a voltage drop lower than 200-300 mV, so that the base-emitter voltage of the parasitic NPN transistor QP is low enough to make the current flow from VDD to VBB is negligible, for example, less than 1 mA. It should be appreciated that because there is negligible current in parasitic transistors QP during a negative going pulse at VBB, there is also a negligible current though resistor $R_{VDD}$ and R (FIG. 5). As such, the nominal operating voltages for analog domain 362 and digital domain 364 are maintained, and the circuits within these domains are able to maintain their states.

In an embodiment, comparator 402 is implemented using comparator structures known in the art. In one embodiment, comparator 402 a differential input pair using NMOS depletion-mode transistors. Alternatively, other input structures using, for example PMOS devices can be used. In one embodiment, the speed of comparator 402 is set so that the gate of the switching transistor is charged within 100 ns. In some embodiments, comparator 402 employs hysteresis.

Figure 7:
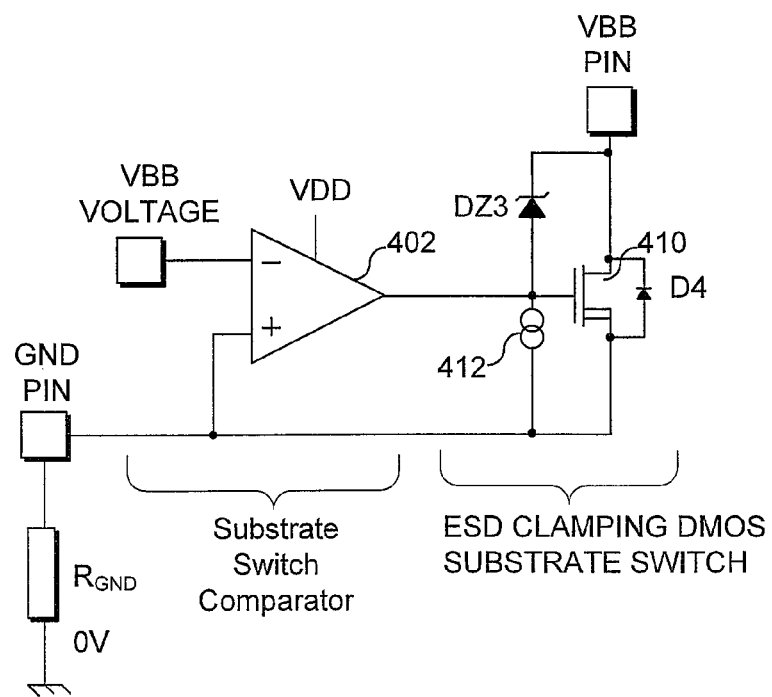
FIG. 7 illustrates a further embodiment substrate switch comparator substrate switch.

FIG. 7 illustrates another embodiment substrate switch comparator 402 and switch, where switch 404 (FIG. 6) is implemented by DMOS device 410. In an embodiment, zener diode DZ3 protects DMOS 410 from an overvoltage condition. Current source 412 pulls down the gate of 410 to prevent activation of the substrate switch during normal operation. In an embodiment, DMOS device 410 is a large enough to maintain a voltage drop of less than about 200-300 mV during a negative going ESD ISO pulse. In one embodiment, the size of the device is between about 0.1 square mm to about 0.2 square mm. In alternative embodiment, the size of the device can be larger or smaller, depending on the particular embodiment and its specifications.

Figure 8:
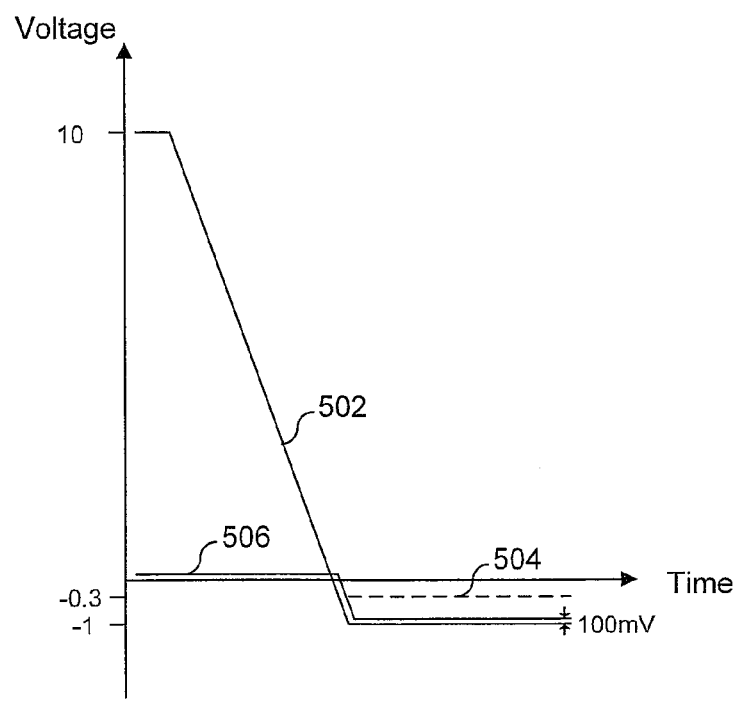
FIG. 8 illustrates a waveform showing the performance of an embodiment ESD device.

FIG. 8 illustrates a waveform showing the performance of an embodiment protection device in response to a negative ISO pulse. Trace 502 represents the voltage at VBB decreasing from 10V to −1V. Trace 504 represents the voltage at GND without the substrate switch comparator being activated. It can be seen in this case that the voltage difference between VBB (trace 502) and GND (trace 504) is about 0.7V, representing the case in which the parasitic bipolar transistors conduct. Curve 506, on the other hand, represents the voltage at GND in a system where the substrate comparator is activated. Here, the voltage at GND is about 100 mV greater than the voltage at VBB for negative VBB voltages. In such a condition, the base-emitter voltage of the parasitic bipolar transistors will be at about 100 mV, which is low enough to prevent appreciable collector current in the parasitic bipolar transistors.

Figure 9:
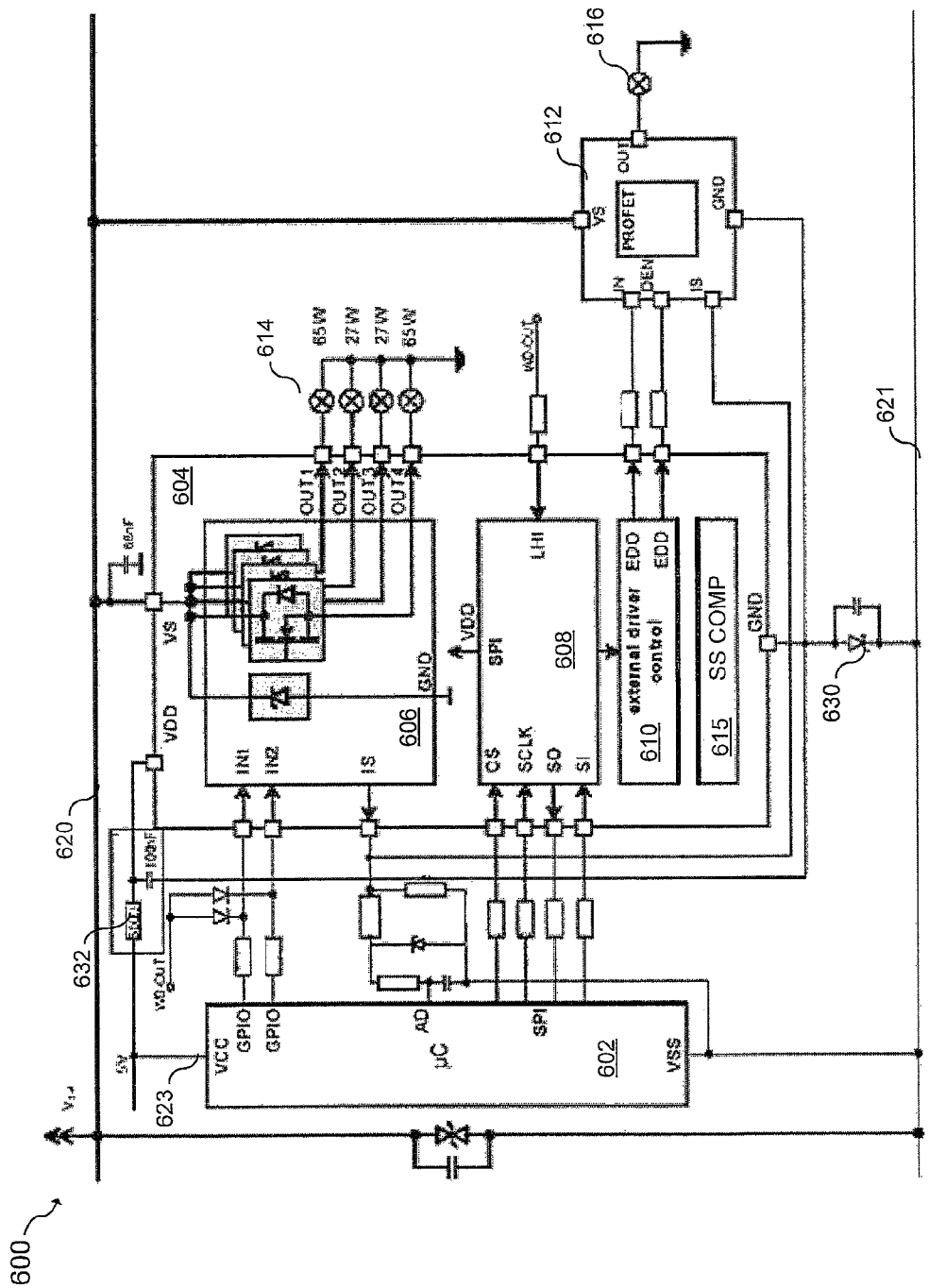
FIG. 9 illustrates an embodiment lighting system.

FIG. 9 illustrates example lighting system 600 according to an embodiment of the present invention. System 600 includes a high-side driver IC 604 coupled to ground 621 via diode 630, high voltage supply 620, and 5V logic supply 623 via 500Ω resistor 632. High side driver IC includes an embodiment substrate comparator/DMOS clamp block 615 that prevents high current flow from the VDD pin to the VS pin if high voltage supply 620 goes below the voltage at ground pin GND. Substrate comparator block 615 operates according to embodiments disclosed above. Diode 630 prevents reverse polarity current flow. Alternatively a resistor can be used in addition to (e.g., in parallel) or in place of diode 630 to limit reverse current flow.

High-side driver IC 604 also has high-side driver circuitry 606 driving lights 614, serial-peripheral interface (SPI) 608 and optional external driver control 610. External driver control 610 is coupled to external driver 612, which drives light 616. In an embodiment SPI 608 and external driver control 610 is powered by 5V logic supply 623. Microprocessor or microcontroller 602 controls high-side driver 604 via SPI 608. In some embodiments, SPI 608 reports system status and current measurements back to microcontroller 602. It should be appreciated that system 600 is just one example of a system using an embodiment substrate comparator/clamping block to prevent high current flow due to activation of a parasitic bipolar transistor.

Figure 10:
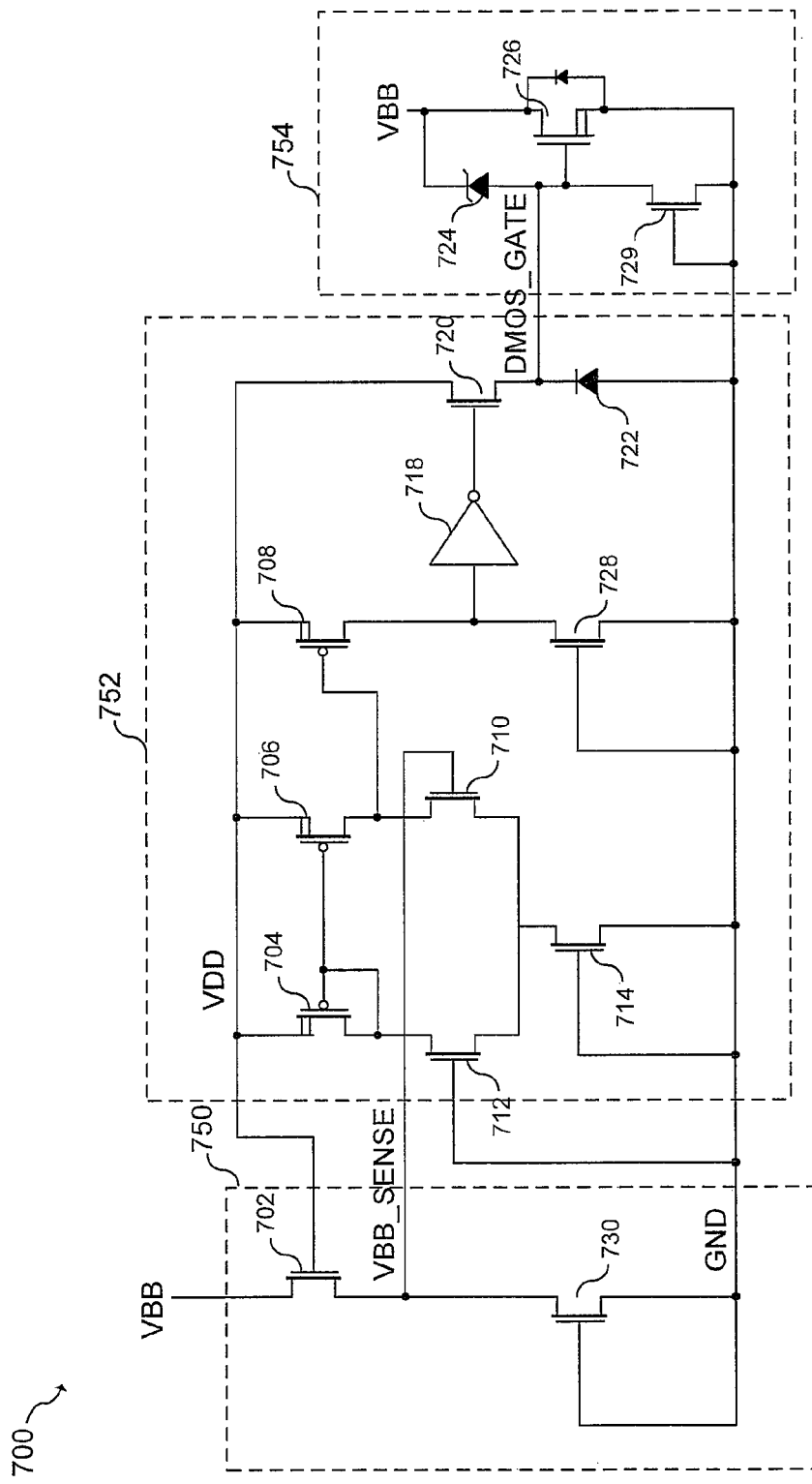
FIG. 10 illustrates an embodiment comparator and substrate clamping circuit.

FIG. 10 illustrates embodiment comparator and substrate clamping circuit 700 having VBB sensing circuit 750, comparator 752 and substrate switch 754. VBB sensing circuit senses battery voltage VBB via high-voltage enhancement mode NMOS device 702 and depletion mode NMOS device 730. When the voltage of VBB falls below VDD, device 702 operates in the linear region, and node VBB_SENSE assumes a voltage of approximately VBB. When VBB falls below the threshold of comparator 752, the output of inverter 718 goes high and pulls the gate of DMOS 726 high via NMOS source follower 720. Substrate switch circuit 754 has depletion mode NMOS pulldown transistors 729, zener diode 724 and DMOS transistor 726, and operates according to embodiments described above. Diode 722 protects the gate of DMOS transistor 726 from overvoltage due to possible capacitive coupling through, for example, the gate-drain capacitance of DMOS transistor 726.

In an embodiment, comparator 752 is implemented by a two-stage comparator having a differential pair input stage with depletion mode NMOS transistors 712 and 710 and PMOS load transistors 704 and 706. The differential pair is biased with NMOS depletion mode transistor 714. The second stage, which drives inverter 718, has PMOS transistor 708 and depletion mode bias transistor 728. In an embodiment, the threshold of comparator 752 threshold is set by making NMOS device 712 wider than NMOS device 710. For example, in one embodiment, NMOS device 712 is made to be about 20% larger than NMOS device 710 in order to offset the threshold voltage. In alternative embodiments, other size offsets can be used. In further alternative embodiments, a voltage offset can be placed in series with on of the inputs of comparator 752 using, for example, a controlled voltage source or a voltage generated by supplying a reference current though a resistors. The voltage offset can also be introduced using other techniques known in the art.

In an embodiment, NMOS transistors 702, 730, 712, 710, 728, 720, 728 and 729 are implemented using depletion mode NMOS devices. In alternative embodiments, some or all of these devices can be implemented using enhancement mode NMOS devices, bipolar transistors, or other device types and/or technologies. For example, in one alternative embodiment, comparator 752 can be implemented using a PMOS input stage. In some embodiments, bias transistors 730, 714, 728 can be implemented using, for example, other current source structures, resistors, or other devices. Furthermore, other comparator structures known in the art can be used.

Advantages of embodiments include the ability to have analog and digital circuits that remain functional in the presence of a negative going ESD ISO pulse, and that are not adversely affected by parasitic currents. Furthermore, in embodiments, that prevent parasitic bipolar activation, the low voltage analog and digital circuits maintain their operating voltages during an negative going ESD ISO pulse, thereby preventing loss of digital and analog states, and the under voltage reset of digital logic circuitry.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
a semiconductor body of a first semiconductor type, the semiconductor body configured to be coupled to a first supply voltage;
a first region of a second semiconductor type disposed in the semiconductor body, wherein
the second semiconductor type is opposite the first semiconductor type,
an interface between the first region and the semiconductor body forms a first diode junction, and
the first region is configured to be coupled to a second supply voltage;
a second region of the first semiconductor type disposed within the first region, the second region configured to be coupled to a third supply voltage;
a comparator having a first input coupled to the semiconductor body and a second input coupled to the first region; and
a switch having a first output node coupled to the first region, a second output node coupled to the semiconductor body, and a control node coupled to an output of the comparator, wherein the comparator is configured to activate the switch when the first diode junction is forward biased.

2. The semiconductor device of claim 1, further comprising a useful circuit disposed in the semiconductor body.

3. The semiconductor device of claim 2, wherein the useful circuit comprises a high-side switching transistor configured to couple an output node to the first supply voltage.

4. The semiconductor device of claim 1, wherein the first semiconductor type is n-type, and the second semiconductor type is p-type.

5. The semiconductor device of claim 4, wherein
the semiconductor body comprises an n-type substrate;
the first region comprises a p-type isolation region; and
the second region comprises an n-well.

6. The semiconductor device of claim 4, wherein
the first supply voltage is nominally first positive supply voltage;
the second supply voltage is nominally a ground voltage; and
the third supply voltage is nominally a positive digital supply voltage.

7. The semiconductor device of claim 1, wherein the comparator is further configured to activate the switch when the first diode junction is zero biased and when the first diode junction is reversed biased up to a first threshold.

8. The semiconductor device of claim 7, wherein the first threshold is between about 5 mV and about 25 mV.

9. The semiconductor device of claim 1, wherein the switch comprises a switching transistor.

10. The semiconductor device of claim 9, wherein the switching transistor comprises an NMOS device.

11. An integrated circuit comprising:
an n-type semiconductor substrate configured to be coupled to a first positive supply connection;
a first p-type region disposed in the n-type semiconductor substrate, the first p-type region configured to be coupled to a ground connection;
a second n-type region disposed in the first p-type region, the second n-type region coupled to a second positive supply connection;
a comparator having a first input coupled to the n-type semiconductor substrate and a second input coupled to first p-type region; and
a switch coupled between the n-type semiconductor substrate and the first p-type region, the switch having a control node coupled to the comparator, wherein the comparator is configured to activate the switch when a voltage difference between the first input and the second input falls below a threshold.

12. The integrated circuit of claim 11, wherein the threshold is between about 5 mV and about 25 mV.

13. The integrated circuit of claim 11, wherein the comparator and the switch is configured to prevent a diode junction formed by the first p-type region and the n-type semiconductor substrate from becoming forward biased to a point of triggering a parasitic bipolar transistor causing appreciable current flow from the second n-type region to the n-type semiconductor substrate.

14. The integrated circuit of claim 11, further comprising a high-side switching transistor configured to couple an output node to the first supply connection.

15. A method of providing protection for a semiconductor device having a substrate of a first semiconductor type coupled to a first supply pin, a first region of a second semiconductor type coupled to a second supply pin, and a third region of the first semiconductor type coupled to a third supply pin, wherein the first region is disposed within the substrate, the second region is disposed within the first region, and the second semiconductor type is opposite the first semiconductor type, the method comprising:
   preventing current flow between the third supply pin and the first supply pin when a first diode junction formed from an interface between the first region and the substrate becomes forward biased, preventing comprising:
      comparing a voltage difference between the first supply pin and the second supply pin to a threshold, and
      closing a switch coupled between the substrate and the first region if the voltage difference transitions from a first side of the threshold to a second side of the threshold.

16. The method of claim 15, wherein measuring the voltage further comprises detecting an ESD pulse on the first supply pin.

17. The method of claim 16, wherein the ESD pulse comprises an ISO pulse.

18. The method of claim 15, wherein the threshold comprises a voltage in which the first diode junction is reverse biased.

19. The method of claim 18, wherein the threshold comprises a voltage in which the first diode is reversed biased between about 5 mV and 25 mV.

20. The method of claim 15, wherein the first semiconductor type is n-type, and the second semiconductor type is p-type.

21. The method of claim 20, wherein:
   the first supply pin comprises a first positive supply pin;
   the second supply pin comprises a ground pin; and
   the third supply pin comprises a second positive supply pin.

22. The method of claim 15, wherein
   comparing comprises using a comparator to compare the voltage difference to the threshold; and
   closing the switch comprises activating a control node of a transistor having a first output node coupled to the first supply pin and a second output node coupled to the second supply pin.

23. The method of claim 15, further comprising:
   coupling a first resistor in series with the first supply pin; and
   coupling a second resistor in series with the second supply pin.

* * * * *